United States Patent
Gupta et al.

(10) Patent No.: US 9,548,739 B2
(45) Date of Patent: Jan. 17, 2017

(54) DRIVE FOR CASCODE STACK OF POWER FETS

(71) Applicant: QUALCOMM Incorporated, San Diego, CA (US)

(72) Inventors: Vishal Gupta, Sunnyvale, CA (US); Chifan Yung, San Jose, CA (US); Joseph Duncan, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/671,553

(22) Filed: Mar. 27, 2015

(65) Prior Publication Data

US 2016/0285454 A1    Sep. 29, 2016

(51) Int. Cl.
    H03K 5/12      (2006.01)
    H03K 3/00      (2006.01)
    H03K 19/0185   (2006.01)
    H03F 3/217     (2006.01)
    H03K 17/10     (2006.01)

(52) U.S. Cl.
    CPC .... *H03K 19/018507* (2013.01); *H03F 3/2173* (2013.01); *H03K 17/102* (2013.01); *H03F 2203/30015* (2013.01); *H03F 2203/30084* (2013.01); *H03F 2203/30117* (2013.01)

(58) Field of Classification Search
    USPC ............. 327/108–111, 170–172; 326/80–82
    See application file for complete search history.

(56) References Cited

U.S. PATENT DOCUMENTS

| | | | |
|---|---|---|---|
| 7,532,701 B2* | 5/2009 | Moon | G11C 19/00 377/64 |
| 8,237,422 B2 | 8/2012 | Singh et al. | |
| 8,330,504 B2 | 12/2012 | Olson | |
| 8,847,636 B2* | 9/2014 | Kerr | H03K 19/00315 327/108 |
| 2009/0179706 A1 | 7/2009 | Wong | |
| 2011/0102070 A1 | 5/2011 | Chen et al. | |

FOREIGN PATENT DOCUMENTS

EP    2824836 A2    1/2015

OTHER PUBLICATIONS

Akbar R., "High Speed Fully Monolithic Self-Triggered DC-DC Buck Converter," Dec. 2013, 80 Pages.
Kursun V., et al., "Cascode Monolithic DC-DC Converter for Reliable Operation at High Input Voltages," Analog Integrated Circuits and Signal Processing, 2005, vol. 42, pp. 231-238.

(Continued)

*Primary Examiner* — An Luu
(74) *Attorney, Agent, or Firm* — Haynes and Boone, LLP

(57) ABSTRACT

Disclosed is a cascode configuration that moves the gate of the cascode substantially without delay relative to an output node by capacitively coupling the latter onto the cascode gates. The passive coupling eliminates the need for actively driving the gates of the cascode. In some embodiments, the only circuitry needed on the cascode gate may be a biasing circuit that limits the swing on the cascode gate between $V_{max}$ and $2 \times V_{max}$, where $V_{max}$ is a transistor device rating.

18 Claims, 5 Drawing Sheets

(56) References Cited

OTHER PUBLICATIONS

Leuschner S., et al., "A 31-dBm, High Ruggedness Power Amplifier in 65-nm Standard CMOS with High-Efficiency stacked-cascode stages", IEEE Radio Frequency Integrated Circuits Symposium (RFIC), 2010, pp. 395-398, XP031684222.
International Search Report and Written Opinion—PCT/US2016/022506—ISA/EPO—Jun. 29, 2016.

* cited by examiner

DRIVE FOR CASCODE STACK OF POWER FETS

BACKGROUND

Unless otherwise indicated, the foregoing is not admitted to be prior art to the claims recited herein and should not be construed as such.

Modern portable applications may require power management devices that connect directly to Li-ion batteries. Such configurations can subject the sensitive circuits of the power management devices to voltages of 4.8V or higher. In 28 nm CMOS technologies, standard IO devices can have a maximum rating ($V_{max}$) of about 2.3V. Higher voltage devices with $V_{max}$ of 5V can be fabricated in 28 nm technology, but at significantly higher mask costs and incurring power efficiency degradation. $V_{max}$ typically refers to the gate-source voltage ($V_{gs}$) or gate-drain voltage ($V_{gd}$) of the device.

Merely to illustrate this point, FIG. 4 shows an example of a power stage using 28 nm technology FETs. For this example, suppose $V_{max}$ is 2.3V and the input voltage $V_{in}$ is $3 \times V_{max}$. The output $V_{out}$ of the power stage will therefore swing from 0V to $3 \times V_{max}$. The gates of Q1 and Q2 may be driven by a gate driver; for example, a switching power supply, a Class D amplifier, etc. FIG. 4 shows a configuration of a switching supply in which the power stage outputs $3 \times V_{max}$. In order for $V_{out}$ to output $3 \times V_{max}$, the gate of Q2 needs to be grounded in order to turn OFF Q2 (the gate of Q1 is driven to $2 \times V_{max}$ in order to turn ON Q1). However, driving the gate of device Q2 to ground when its drain is at $3 \times V_{max}$ creates a condition where $V_{gd}$ of Q2 exceeds its $V_{max}$ rating, which over time can break down the gate oxide layer.

SUMMARY

A circuit in accordance with the present disclosure may include an output transistor having an output terminal and a control terminal. A capacitive coupling between the control terminal and the output terminal may be configured to drive the control terminal with a coupled signal that continuously tracks an output signal on the output terminal. A biasing circuit connected to the control terminal may be configured to provide a DC bias voltage that is combined with the coupled signal to provide a drive signal on the control terminal.

In some aspects, the circuit may further include a first transistor device and a second transistor device. The second transistor device may be a cascode of the first transistor device. The first transistor device may have an input terminal configured for a connection to an input voltage, wherein the capacitive coupling includes a first capacitance between the control terminal of the output transistor device and the output terminal of the output transistor device and a second capacitance between the input terminal of the first transistor device and the control terminal of the output transistor device.

In some aspects, the capacitive coupling between the control terminal of the output transistor device and the output terminal of the output transistor device may be a parasitic capacitance between the control terminal and the output terminal. In some aspects, the capacitive coupling may be a capacitor connected between the control terminal and the output terminal.

A circuit in accordance with the present disclosure may include a first stack comprising a first transistor, a second transistor, and a third transistor. The third transistor may have a control terminal and an output terminal. The circuit may further include a second stack connected to the first stack at a node. A biasing circuit may be connected to the control terminal of the third transistor device. A capacitive coupling between the control terminal of the third transistor and the output terminal of the third transistor may be configured to couple an output signal at the output terminal as a coupled signal to the control terminal.

The biasing circuit may be configured to provide a DC bias voltage that combines with the coupled signal to produce a drive signal on the control terminal. The biasing circuit may be further configured to respond substantially without delay to changes in a voltage level of the drive signal and vary a voltage level of the DC bias voltage to remain between a first voltage level and a second voltage level in response to changes in the voltage level of the drive signal.

In some aspects, the capacitive coupling may include a parasitic capacitance between the output terminal of the third transistor device and the control terminal of the third transistor device. In some aspects, the capacitive coupling may further include a second capacitor between the output terminal of the third transistor device and the control terminal of the third transistor device.

A method in a circuit in accordance with the present disclosure may include providing a divided output signal at an output terminal of the transistor as a coupled signal to a control terminal of the transistor using a capacitive coupling between the output terminal and the control terminal. A DC bias voltage may be generated and combined with the coupled signal to provide a drive signal on the control terminal of the transistor. The method may include responding, substantially without delay, to variations in a voltage level of the drive signal by varying a voltage level of the DC bias voltage to remain between a first voltage level and a second voltage level.

A circuit in accordance with the present disclosure may include means for providing a divided output signal at an output terminal of a transistor in the circuit as a coupled signal to a control terminal of the transistor using a capacitive coupling between the output terminal and the control terminal, means for generating a DC bias voltage, means for providing a drive signal on the control terminal of the transistor by combining the DC bias voltage with the coupled signal, and means for responding, substantially without delay, to variations in a voltage level of the drive signal by varying a voltage level of the DC bias voltage to remain between a first voltage level and a second voltage level.

The following detailed description and accompanying drawings provide a better understanding of the nature and advantages of the present disclosure.

BRIEF DESCRIPTION OF THE DRAWINGS

With respect to the discussion to follow and in particular to the drawings, it is stressed that the particulars shown represent examples for purposes of illustrative discussion, and are presented in the cause of providing a description of principles and conceptual aspects of the present disclosure. In this regard, no attempt is made to show implementation details beyond what is needed for a fundamental understanding of the present disclosure. The discussion to follow, in conjunction with the drawings, makes apparent to those of skill in the art how embodiments in accordance with the present disclosure may be practiced. In the accompanying drawings.

DETAILED DESCRIPTION

In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples, alone or in combination with other features described below, and may further include modifications and equivalents of the features and concepts described herein.

Figure 1:
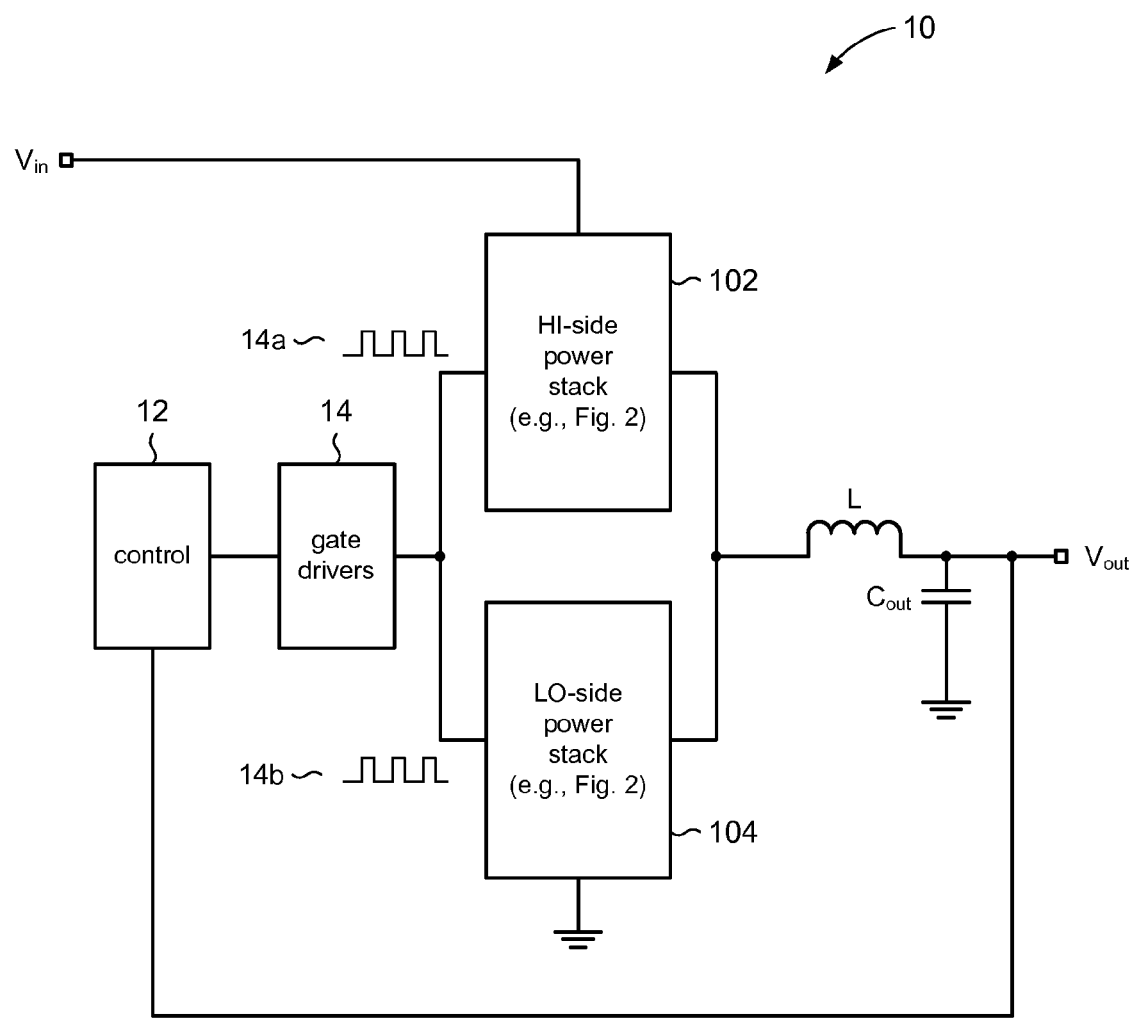
FIG. 1 illustrates a high level block diagram of a power supply in accordance with embodiments of the present disclosure.

FIG. 1 shows a switched power supply 10 configured in accordance with the present disclosure to supply an output voltage $V_{out}$ from an input supply voltage $V_{in}$. The configuration shown in FIG. 1 represents a buck converter. However, persons of ordinary skill will appreciate that any switched power supply architecture may be configured in accordance with the present disclosure; e.g., boost converter, Class D amplifier, and the like. A control section 12 may receive the output voltage $V_{out}$ of the switched power supply 10 as feedback signal to control a gate driver section 14. The gate driver section 14 may generate drive signals 14a to drive a HI-side stack 102 and drive signals 14b to drive a LO-side stack 104. Inductor L and output capacitor $C_{out}$ may complete the buck converter.

Figure 2:
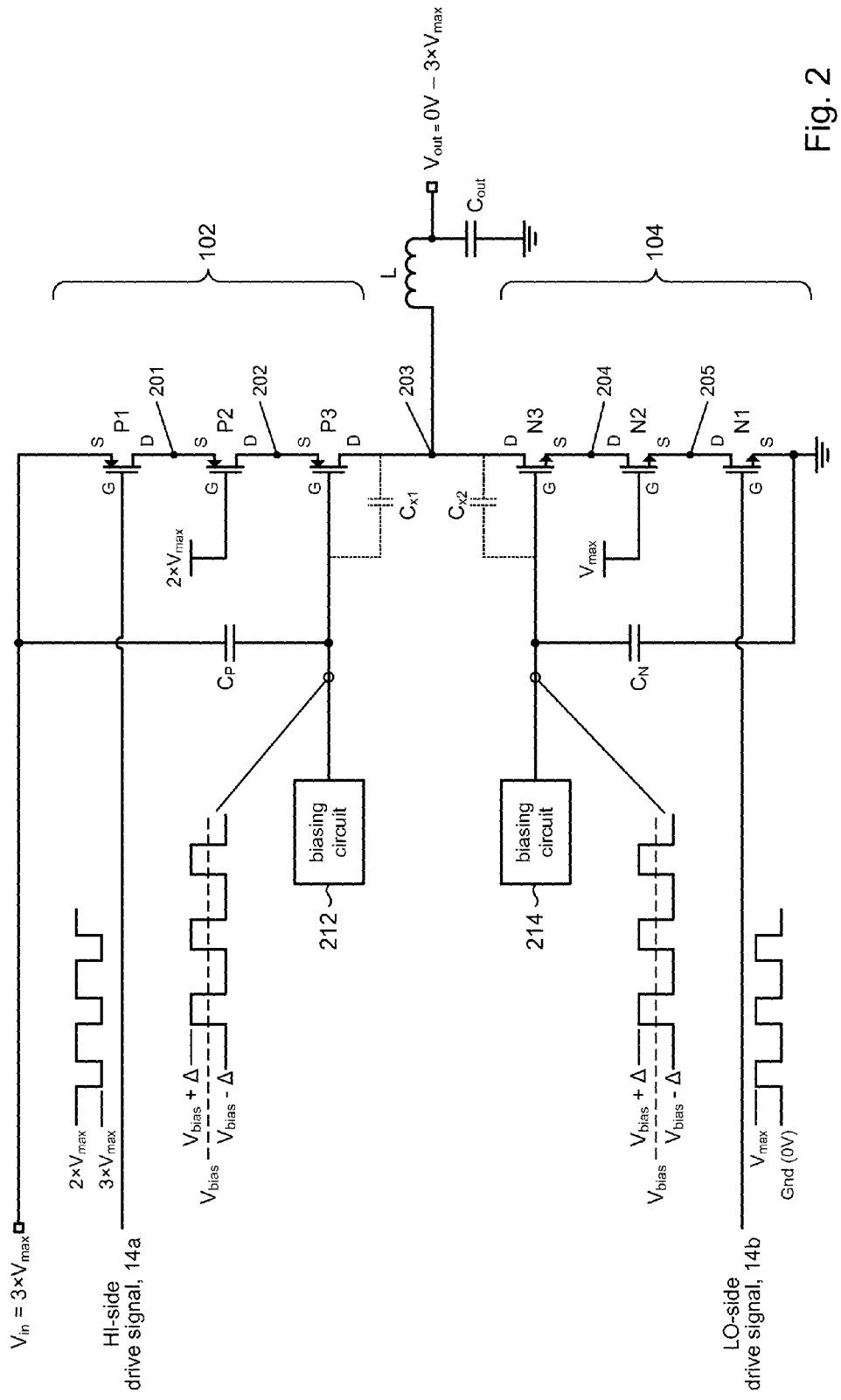
FIGS. 2 and 2A illustrate cascode stacks in accordance with the present disclosure.

As shown in FIG. 2, in some embodiments, the HI-side stack 102 and LO-side stack 104, each, may comprise a cascode stack configuration. The HI-side stack 102 and LO-side stack 104 may connect at an output node 203. For the purposes of explanation, the supply voltage $V_{in}$ will be $3 \times V_{max}$ and $V_{out}$ can swing between 0V and $3 \times V_{max}$, where $V_{max}$ represents the maximum transistor $V_{gd}$. For example, if $V_{max}$ is 1.8V, then $V_{out}$ can swing from 0V to 5.4V. For a configuration where $V_{in}=3 \times V_{max}$ and $V_{max}$ is 1.8V, HI-side stack 102 may comprise three transistor devices $P_1$, $P_2$, $P_3$. In some embodiments, the transistor devices may be PMOS devices. Likewise, the LO-side stack 104 may comprise three transistor devices $N_1$, $N_2$, $N_3$, which in some embodiments may be NMOS devices. It will be appreciated that the HI-side stack 102 and LO-side stack 104 may be configured with different numbers of transistors depending on parameters such as $V_{in}$ and $V_{max}$.

In some embodiments, the HI-side drive signal 14a may be coupled to the gate of $P_1$. The HI-side drive signal 14a may be a pulse that swings between $3 \times V_{max}$ and $2 \times V_{max}$. The LO-side drive signal 14b may be coupled to the gate of $N_1$. The LO-side drive signal 14b may be a pulse that swings between 0V and $V_{max}$. In accordance with the present disclosure, the gates of $P_2$ and $N_2$ are not driven by the gate drive circuitry and may be biased at fixed voltages. In some embodiments, for example, the gate of $P_2$ may be biased at a fixed DC level of $2 \times V_{max}$, and similarly, the gate of $N_2$ may be biased at a fixed DC level of $V_{max}$.

In accordance with the present disclosure, a biasing circuit 212 may be connected to the gate of $P_3$. A biasing capacitor $C_p$ may be connected between a supply rail for $V_{in}$ and the gate of $P_3$. A biasing circuit 214 may be connected to the gate of $N_3$, and a biasing capacitor $C_n$ may be connected between ground potential and the gate of $N_3$. The biasing circuits 212, 214 may be configured as means for generating a DC bias $V_{bias} \pm \Delta$. $V_{bias}$ may be a value between $2 \times V_{max}$ and $V_{max}$. In some embodiments, for example, $V_{bias}$ may be $1.5 \times V_{max}$.

The drain of $P_3$ may be capacitively coupled to the gate of $P_3$, thus coupling an output signal at node 203, as a coupled signal, to the gate of $P_3$. The output of the biasing circuit 212 may be combined with the coupled signal as means for providing a drive signal on the gate of $P_3$. Likewise, the drain of $N_3$ may be capacitively coupled to the gate of $N_3$, thus coupling the output signal at node 203, as a coupled signal, to the gate of $N_3$. The output of the biasing circuit 214 may be combined with the coupled signal as means for providing a drive signal on the gate of $N_3$.

Figure 2A:
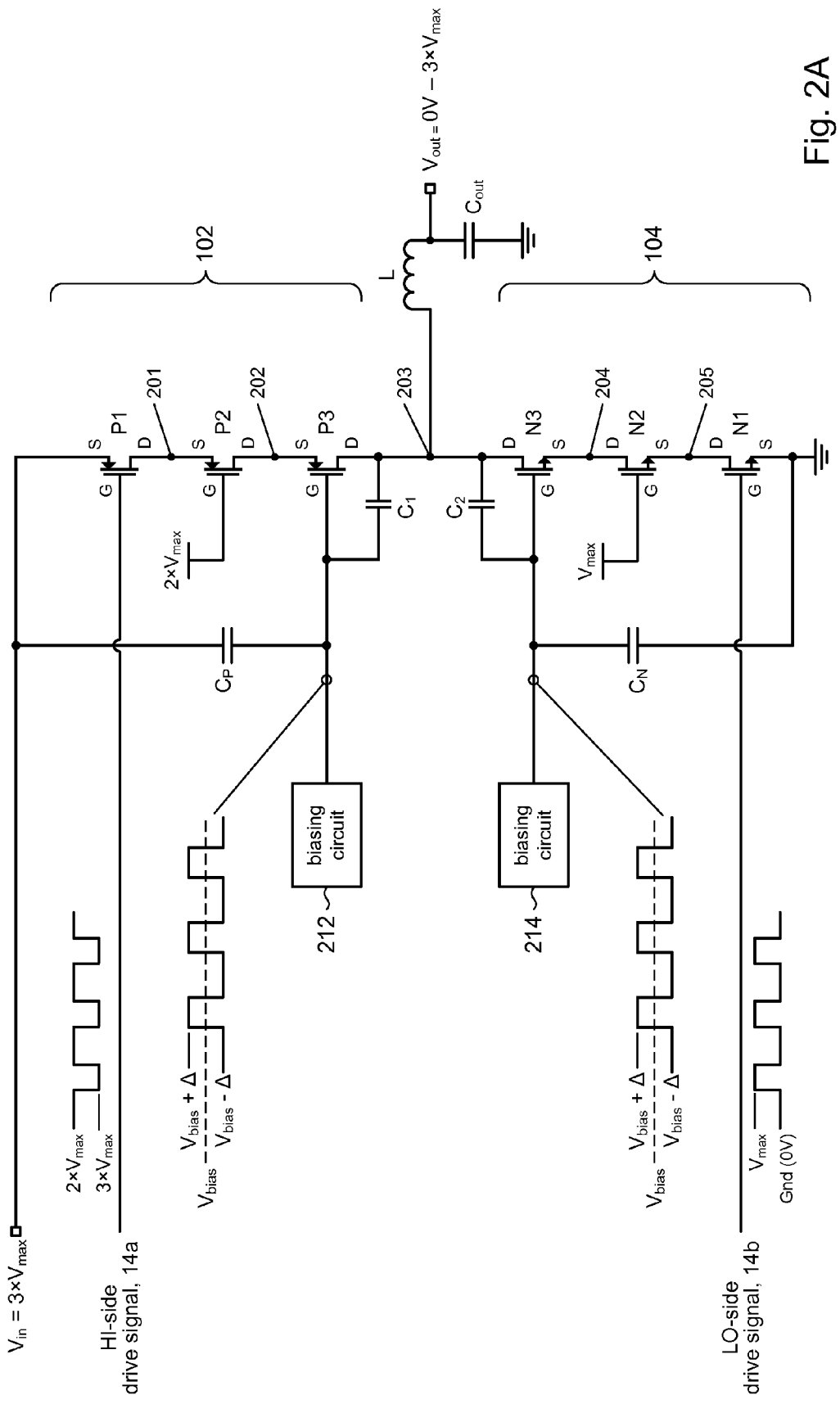

In some embodiments, the parasitic capacitances $C_{x1}$, $C_{x2}$, respectively, of transistors $P_3$ and $N_3$ may provide the respective capacitive coupling. As persons of ordinary skill understand, parasitic capacitances arise within the structures of transistor device, such as the gate and drain regions. In other embodiments, explicit capacitors may used. FIG. 2A for example, illustrates an embodiment using explicit capacitive elements $C_1$, $C_2$, in addition to respective parasitic capacitances $C_{x1}$, $C_{x2}$. The capacitive elements $C_1$, $C_2$ are explicit or discrete devices in the same way that the transistors $P_3$ and $N_3$ are explicit or discrete devices.

Figure 3:
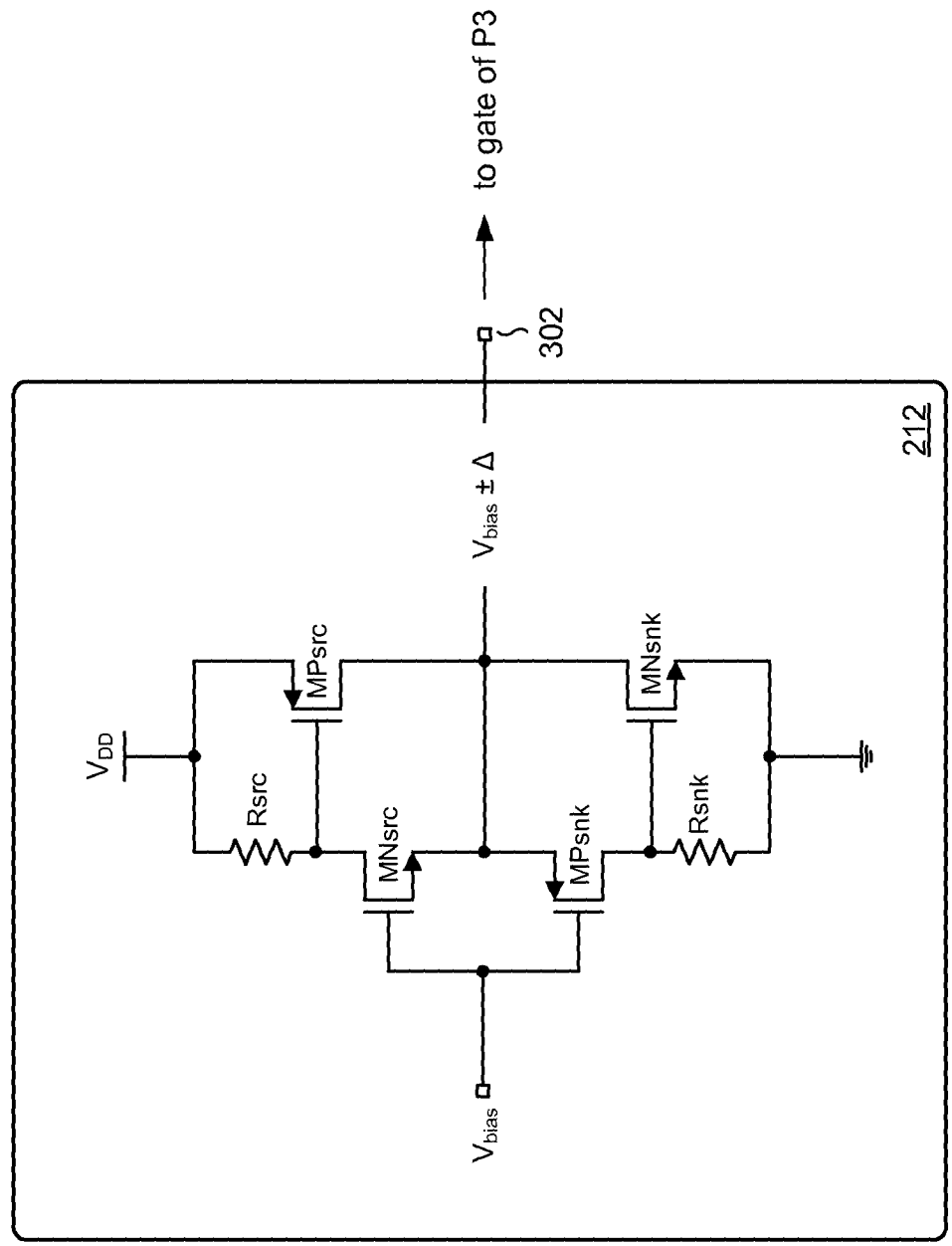
FIG. 3 illustrates an example of a biasing circuit.
Figure 4:
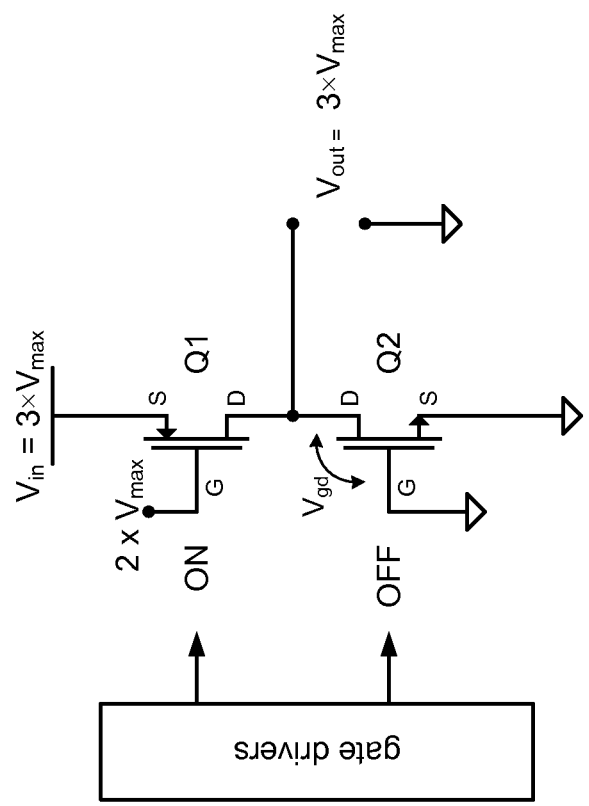
FIG. 4 illustrates a conventional design.

FIG. 3 shows an illustrative example of a biasing circuit 212 shown in FIG. 2, in accordance with some embodiments of the present disclosure. The biasing circuit 214 may be similarly constructed.

The $V_{bias}$ voltage sets the DC bias level of the biasing circuit 212. Node 302 connects to the gate of $P_3$, as shown in FIG. 2. When the voltage at the gate of $P_3$ deviates (up or down) from $V_{bias}$ by an amount $\Delta$, transistor $MN_{src}$ or $MP_{snk}$ will turn ON to compensate. In some embodiments, the $\Delta$ may be the transistors' $V_{th}$ (threshold voltage). In some embodiments, additional compensation ($R_{src}$, $MP_{src}$ and $R_{snk}$, $MN_{snk}$) can be provided.

In operation, suppose the voltage at node 302 rises above $V_{bias}+\Delta$, this event will turn ON $MP_{snk}$ as compensation to drive down the voltage at node 302. When the voltage at node 302 reaches or falls below $V_{bias}+\Delta$, $MP_{snk}$ will turn OFF. Depending on how much current is being sinked across $R_{snk}$, $MN_{snk}$ may turn ON as well to provide further compensation.

Conversely, if the voltage at node 302 falls below $V_{bias}-\Delta$, this event will turn ON $MN_{src}$ as compensation to drive up the voltage at node 302. When the voltage at node 302 reaches or exceeds below $V_{bias}-\Delta$, $MN_{src}$ will turn OFF. Depending on how much current is being sourced across $R_{src}$, $MP_{src}$ may turn ON as well to provide further compensation.

The biasing circuit 212 shown in FIG. 3 can therefore maintain the DC bias level between $V_{bias}+\Delta$ and $V_{bias}-\Delta$ in real time; the only delay is due to signal propagation delays between the transistor devices that comprise the biasing circuit 212. The biasing circuit 212 illustrates an example of a means for responding, substantially without delay, to variations in a voltage level at node 302 to maintain the DC bias voltage between $V_{bias}+\Delta$ and $V_{bias}-\Delta$. It will be appreciated of course that the circuit shown in FIG. 3 is merely illustrative of a biasing circuit in accordance with some embodiments of the present disclosure. Persons of ordinary skill can readily implement other equivalent circuits.

A brief discussion of the operation of the cascode stack shown in FIG. 2 will now be given. The gate driver section 14 (FIG. 1) can cycle the HI-side stack 102 and the LO-side stack 104 between a conductive state and a non-conductive state. For example, when the gate driver section 14 drives HI-side stack 102 to be conductive, the LO-side stack 104 is driven non-conductive, and vice-versa when the gate driver section 14 drives HI-side stack 102 to be non-conductive, the LO-side stack 104 is driven conductive.

In a first cycle, for example, suppose the HI-side stack 102 is driven conductive and the LO-side stack 104 is driven non-conductive. On the HI-side stack 102, the gate driver section 14 can drive the gate of $P_1$ to $2 \times V_{max}$ to turn ON $P_1$. Consequently, the voltage at node 201 will rise to $3 \times V_{max}$. Since the gate of $P_2$ is DC-biased at $2 \times V_{max}$, $P_2$ will turn ON. Consequently, the voltage at node 202 will rise to $3 \times V_{max}$.

Recall from the discussion above, that the biasing circuit 212 provides a bias voltage $V_{bias}$ at the gate of $P_3$ between $2 \times V_{max}$ and $V_{max}$. Accordingly, $P_3$ will turn ON, since node 202 is at $3 \times V_{max}$. As the voltage at node 203 rises to $3 \times V_{max}$, so too will the gate voltage of $P_3$ rise by virtue of the capacitive coupling (e.g., $C_{x1}$), which couples at least a portion of the output voltage at node 203 to the gate of $P_3$. For example, the bias capacitor $C_p$ and $C_{x1}$ (or $C_1$ in FIG. 2A) may define a capacitive voltage divider configured as means for providing a divided potion of the output voltage a node 203 to the gate of $P_3$. As a result of the capacitive coupling, the gate voltage at $P_3$ can track in real time, substantially without delay, the output voltage at node 203 so that $V_{gd}$ of $P_3$ does not exceed $V_{max}$. Since the biasing circuit 212 is configured to maintain the gate voltage of $P_3$ between $2 \times V_{max}$ and $V_{max}$, the gate voltage of $P_3$ will be limited (clamped) to a maximum voltage of $2 \times V_{max}$ as node 203 continues to rise to $3 \times V_{max}$.

Turning to operation of the LO-side stack 104, in the first cycle the gate driver section 14 may drive the LO-side stack 104 to a non-conductive state. The gate driver section 14 may drive the gate of $N_1$ to ground potential, thus turning OFF $N_1$. Since the gate of $N_2$ is DC-biased at $V_{max}$, node 205 will rise to $V_{max}$, thus ensuring that $N_2$ is OFF.

At $N_3$, as the voltage at node 203 rises to $3 \times V_{max}$, so too will the gate voltage of $N_3$ rise by virtue of the capacitive coupling (e.g., $C_{x2}$), which couples at least a portion of the output voltage at node 203 to the gate of $N_3$. For example, the bias capacitor $C_n$ and the $C_{x2}$ (or $C_2$ in FIG. 2A) may define a capacitive voltage divider that provides a divided potion of the output voltage a node 203 to the gate of $N_3$. As a result, the gate voltage at $N_3$ can track in real time substantially without delay the output voltage at node 203 so that $V_{gd}$ of $N_3$ does not exceed $V_{max}$. Since the biasing circuit 214 is configured to maintain the gate of $N_3$ between $2 \times V_{max}$ and $V_{max}$, the gate voltage of $N_3$ will be limited (clamped) to $2 \times V_{max}$ as node 203 continues to rise to $3 \times V_{max}$. The voltage at node 204 will rise to the gate voltage of $N_3$, namely $2 \times V_{max}$, thus ensuring that $N_3$ is OFF. By limiting the maximum gate voltage of $N_3$ to $2 \times V_{max}$, the $V_{gd}$ of $N_3$ will not exceed the $V_{max}$ rating of $N_3$ when the voltage at node 203 reaches $3 \times V_{max}$.

Consider next a second cycle, that follows the first cycle, in which the HI-side stack 102 can be driven non-conductive and the LO-side stack 104 can be driven conductive. On the LO-side stack 104, the gate driver section 14 may drive the gate of $N_1$ to $V_{max}$, thus turning ON $N_1$ and bringing node 205 to ground potential. Since the gate of $N_2$ is DC-biased at $V_{max}$, $N_2$ will also turn ON and bring node 204 to ground potential. Recall from the first cycle, the gate voltage of $N_3$ is at $2 \times V_{max}$. Accordingly, $N_3$ turns ON and node 203 will go from $3 \times V_{max}$ to ground potential. As the node 203 goes to ground potential, so too will the gate voltage of $N_3$ as the gate voltage of $N_3$ tracks in real time substantially without delay the output signal at node 203 by virtue of the capacitive coupling (e.g., $C_{x2}$). The biasing circuit 214, however, will limit the minimum voltage level at the gate of $N_3$ to $V_{max}$.

Turning to the HI-side stack 102, in the second cycle the gate driver section 14 can drive the HI-side stack 102 to a non-conductive state. The gate driver section 14 can drive the gate of $P_1$ to $3 \times V_{max}$, which will turn OFF $P_1$. With $P_1$ in the OFF state, the voltage at node 201 will equalize with the gate voltage of $P_2$, namely $2 \times V_{max}$, thus turning OFF $P_2$. Likewise, with $P_2$ in the OFF state, the voltage at node 202 will equalize with the gate voltage at $P_3$. Recall from the first cycle, the gate voltage of $P_3$ is at $2 \times V_{max}$, and so the node 202 will become $2 \times V_{max}$, and $P_3$ will turn OFF.

As the node 203 goes from $3 \times V_{max}$ to ground potential, so too will the gate voltage of $P_3$ as the gate voltage of $P_3$ tracks in real time substantially without delay the output signal at node 203 by virtue of the capacitive coupling (e.g., $C_{x1}$). The biasing circuit 212, however, will limit the minimum voltage level at the gate of $P_3$ to $V_{max}$. By limiting the minimum gate voltage of $P_3$ to $V_{max}$, the $V_{gd}$ of $P_3$ will not exceed the $V_{max}$ rating of $P_3$ when the voltage at node 203 drops to ground potential.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

We claim the following:

1. A circuit comprising:
   a transistor stack comprising a series connection of a first transistor device, a second transistor device, and an output transistor device, the output transistor device having an output terminal and a control terminal, the first transistor device having an input terminal configured for a connection to a control voltage;
   a capacitive coupling between the control terminal and the output terminal configured to drive the control terminal with a coupled signal that continuously tracks an output signal on the output terminal; and
   a biasing circuit connected to the control terminal of the output transistor device, the biasing circuit configured to provide a DC bias voltage that is combined with the coupled signal to provide a drive signal on the control terminal, the biasing circuit further configured to respond to changes in a voltage level of the drive signal substantially with no delay in order to maintain a voltage level of the DC bias voltage between a first voltage level and a second voltage level.

2. The circuit of claim 1, wherein the second transistor device is a cascode of the first transistor device, wherein the capacitive coupling comprises a first capacitance between the control terminal of the output transistor device and the output terminal of the output transistor device,
   the circuit further comprising a second capacitance between the input terminal of the first transistor device and the control terminal of the output transistor device.

3. The circuit of claim 1, wherein the capacitive coupling between the control terminal of the output transistor device and the output terminal of the output transistor device comprises a parasitic capacitance between the control terminal and the output terminal.

4. The circuit of claim 1, wherein the capacitive coupling between the control terminal of the output transistor device and the output terminal of the output transistor device comprises a capacitor connected between the control terminal and the output terminal.

5. The circuit of claim 1, further comprising:
a fourth transistor device;
a fifth transistor device connected as a cascode of the fourth transistor device;
a second output transistor device connected as a cascode of the fifth transistor device, the second output transistor device having an output terminal and a control terminal;
a capacitive coupling between the control terminal and the output terminal configured to drive the control terminal with a coupled signal that continuously tracks an output signal on the output terminal; and
a biasing circuit connected to the control terminal, the biasing circuit configured to provide a DC bias voltage that is combined with the coupled signal to provide a drive signal on the control terminal, the biasing circuit further configured to respond without delay to changes in a voltage level of the drive signal in order to maintain a voltage level of the DC bias voltage between a first voltage level and a second voltage level.

6. The circuit of claim 5, wherein the capacitive coupling between the control terminal of the second output transistor device and the output terminal of the second output transistor device comprises a parasitic capacitance between the control terminal and the output terminal.

7. The circuit of claim 5, wherein the capacitive coupling between the control terminal of the second output transistor device and the output terminal of the second output transistor device comprises a capacitor connected between the control terminal and the output terminal.

8. A circuit comprising:
a first stack comprising a first transistor, a second transistor, and a third transistor, the third transistor comprising a control terminal and an output terminal;
a second stack connected to the first stack at a node;
a biasing circuit connected to the control terminal of the third transistor; and
a capacitive coupling between the control terminal of the third transistor and the output terminal of the third transistor configured to couple an output signal at the output terminal as a coupled signal to the control terminal,
the biasing circuit configured to provide a DC bias voltage that combines with the coupled signal to produce a drive signal on the control terminal, the biasing circuit further configured to respond to changes in a voltage level of the drive signal with substantially no delay and maintain a voltage level of the DC bias voltage between a first voltage level and a second voltage level as the voltage level of the drive signal changes.

9. The circuit of claim 8, wherein the capacitive coupling comprises a parasitic capacitance between the output terminal of the third transistor device and the control terminal of the third transistor device.

10. The circuit of claim 8, wherein the capacitive coupling comprises an explicit capacitor between the output terminal of the third transistor device and the control terminal of the third transistor device.

11. The circuit of claim 8, further comprising a capacitor connected between the first transistor device and the third transistor device.

12. The circuit of claim 8, wherein the second stack comprises:
a fourth transistor device;
a fifth transistor device connected as a cascode of the fourth transistor device;
a sixth transistor device connected as a cascode of the fifth transistor device, the sixth transistor device having an output terminal and a control terminal;
a capacitive coupling between the control terminal of the sixth transistor device and the output terminal of the sixth transistor device configured to couple to the control terminal with a coupled signal that continuously tracks an output signal on the output terminal of the sixth transistor device; and
a biasing circuit configured to provide a DC bias voltage that combines with the coupled signal to produce a drive signal on the control terminal, the biasing circuit further configured to respond to changes in a voltage level of the drive signal substantially with no delay to maintain a voltage level of the DC bias voltage between a first voltage level and a second voltage level as the voltage level of the drive signal changes.

13. A method in a transistor comprising:
providing a divided output signal at an output terminal of the transistor as a coupled signal to a control terminal of the transistor using a capacitive coupling between the output terminal and the control terminal;
generating a DC bias voltage;
providing a drive signal on the control terminal of the transistor by combining the DC bias voltage with the coupled signal; and
responding, substantially without delay, to variations in a voltage level of the drive signal by maintaining a voltage level of the DC bias voltage between a first voltage level and a second voltage level,
wherein the capacitive coupling comprises a first capacitor connected between the output terminal and the control terminal and a second capacitor connected between a power rail and the control terminal to define a capacitive voltage divider.

14. The method of claim 13, wherein the first capacitor comprises a parasitic capacitance between the output terminal and the control terminal.

15. The method of claim 14, wherein the first capacitor comprises a physical capacitor.

16. A circuit comprising:
means for providing a divided output signal at an output terminal of a transistor in the circuit as a coupled signal to a control terminal of the transistor using a capacitive coupling between the output terminal and the control terminal;
means for generating a DC bias voltage;
means for providing a drive signal on the control terminal of the transistor by combining the DC bias voltage with the coupled signal; and
means for responding, substantially without delay, to variations in a voltage level of the drive signal to maintain a voltage level of the DC bias voltage between a first voltage level and a second voltage level, wherein the capacitive coupling comprises a first capacitor connected between the output terminal and the control terminal and a second capacitor connected between a power rail and the control terminal to define a capacitive voltage divider.

17. The circuit of claim 16, wherein the first capacitor comprises a parasitic capacitance between the output terminal and the control terminal.

18. The circuit of claim 17, wherein the first capacitor comprises a physical capacitor.

* * * * *